US008773296B1

(12) United States Patent
Dusatko et al.

(10) Patent No.: US 8,773,296 B1
(45) Date of Patent: Jul. 8, 2014

(54) INTERLEAVED DIGITAL TO ANALOG CONVERSION

(71) Applicant: PMC-Sierra US, Inc., Sunnyvale, CA (US)

(72) Inventors: Tomas Dusatko, Vancouver (CA); William Michael Lye, Coquitlam (CA)

(73) Assignee: PMC-Sierra US, Inc., Sunnyvale, CA (US)

( * ) Notice: Subject to any disclaimer, the term of this patent is extended or adjusted under 35 U.S.C. 154(b) by 0 days.

(21) Appl. No.: 13/624,719

(22) Filed: Sep. 21, 2012

(51) Int. Cl.
*H03M 1/66* (2006.01)
(52) U.S. Cl.
USPC .......................................... 341/144; 341/143
(58) Field of Classification Search
USPC ................................................. 341/143, 144
See application file for complete search history.

(56) References Cited

U.S. PATENT DOCUMENTS

| | | | |
|---|---|---|---|
| 6,218,974 B1 | 4/2001 | Dedic | |
| 6,621,366 B1 * | 9/2003 | Gentile | 332/103 |
| 6,621,437 B2 | 9/2003 | Khalil et al. | |
| 6,876,319 B2 * | 4/2005 | Webster et al. | 341/143 |
| 6,977,602 B1 | 12/2005 | Ostrem et al. | |
| 6,987,953 B2 * | 1/2006 | Morris et al. | 455/102 |
| 7,312,737 B2 | 12/2007 | Jungerman et al. | |
| 7,679,538 B2 | 3/2010 | Tsang | |
| 8,410,843 B2 * | 4/2013 | Goodman et al. | 327/551 |

OTHER PUBLICATIONS

Park et al., "A Digital-to-Analog Converter Based on Differential-Quad Switching," IEEE Journal of Solid-State Circuits, vol. 37, No. 10, Oct. 2002, pp. 1335-1338.
Pham et al. "A Time-Interleaved ΔΣ-DAC Architecture Clocked at the Nyquist Rate," IEEE Transactions on Circuits and Systems-II: Express Briefs, vol. 55, No. 9, Sep. 2008, pp. 858-862.
Schofield et al., "A 16b 400Ms/s DAC with <-80dBc IMd to 300MHz and <-160dBm/Hz Noise Power Spectral Density," IEEE International Solid-state circuits conference, Feb. 2003, 10 pages.

* cited by examiner

*Primary Examiner* — Khai M Nguyen
(74) *Attorney, Agent, or Firm* — Dennis R. Haszko

(57) ABSTRACT

A method and apparatus for interleaving high-speed, delta-sigma based over-sampled DACs. A delta-sigma modulator is decomposed into a parallel poly-phase block-filter running at a lower rate. The generated parallel digital data is then fed directly to the analog DAC output stage where it is directly combined to form the full-rate signal using a 1-hot-of-N output stage. By using a poly-phase implementation, the complexity of the high-speed parallel digital-analog timing interface is simplified, along with the timing requirements of the delta-sigma modulator which normally would have to run at the full-oversampled rate. The 1-hot-of-N signal encoding is directly generated from the parallel delta-sigma modulator, and efficiently encodes the data in such a way to minimize signal-dependent supply noise. The architecture disclosed is advantageous for the practical implementation of high-speed over-sampled DACs, such as those used in stringent wireless applications.

19 Claims, 16 Drawing Sheets

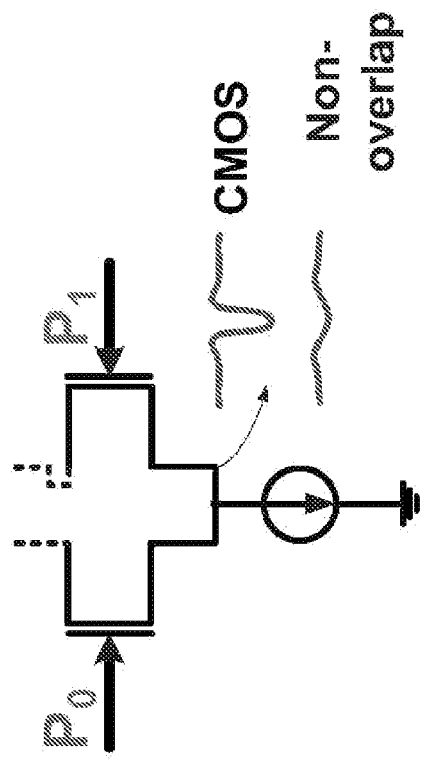
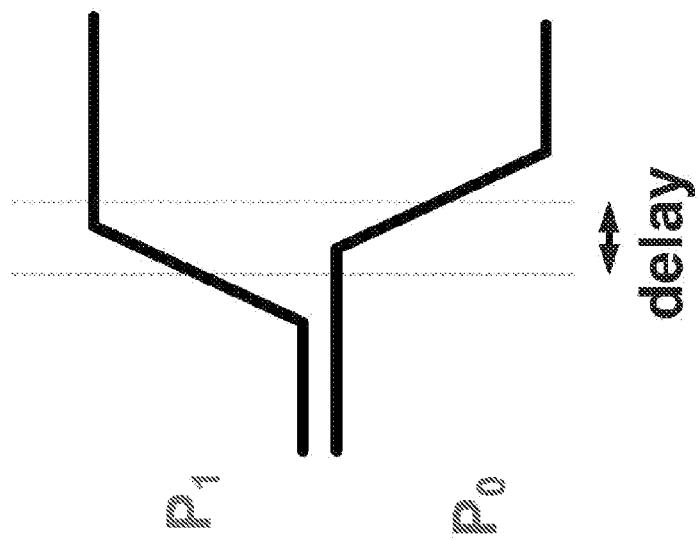
FIG. 10B
FIG. 10A

INTERLEAVED DIGITAL TO ANALOG CONVERSION

FIELD

The present disclosure relates generally to digital to analog converters (DACs). More particularly, the present disclosure relates to a DAC designed to synthesize high-bandwidth, high-resolution signals while maintaining very good noise and linearity.

BACKGROUND

High-sample rate, high-linearity DACs are commonly employed in state-of-the art radio frequency (RF) radio transmit paths to convert base-band and intermediate-frequency (IF) data from the digital to analog domains. In some cases, these signals are then fed into an up-conversion mixer where they are translated to a higher RF frequency. In other cases, more advanced DACs have been used to output the RF signal directly at very high sample rates (>4 Gsps). Regardless of the particular system architecture, a common feature of these DACs is that they support a very wide output bandwidth typically on the order of >300 MHz, and must maintain high-linearity with a fairly low noise floor.

Since these demanding applications tend to require high-resolution (>14 bits), the size and complexity of these DACs are also quite high. One way to reduce the number of physical bits required is to use a delta-sigma modulator and over-sampling. This process is summarized in FIG. 1.

FIG. 1 illustrates a known oversampled digital to analog converter. This example illustrates the case where the data is over-sampled by a factor of 2×. The input data is sampled at a rate $f_s$, and is $N_{data}$ bits wide. In a typical known system, $N_{data}$>14 bits and $f_s$>600 Msps. This digital data stream is then up-sampled (increased in sample rate) at an up-sampler 10 by the over-sample factor to $2*f_s$. After low-pass filtering in a low-pass filter 12, this data is then passed through a delta-sigma modulator (DSM) 14 which truncates $N_{data}$ to a lower number of bits $N_{dsm}$. The result of this truncation would normally increase the noise-floor of the data; however, the delta-sigma modulator is specifically designed to take this extra noise and move it to higher frequencies out-of-band as shown in dashed lines in areas (d), (e) and (f) of FIG. 1.

The main advantage here is that the high-resolution input data is now effectively compressed into a lower number of physical bits, which allows for a simpler design of the analog DAC 16. For example, normally an $N_{data}$=16-bit data signal would require an analog DAC that can synthesize ~$2^{16}$ unique levels. In the case of a delta-sigma architecture where this is compressed to $N_{dsm}$=10-bits, the physical DAC can represent the same signal, without any loss of information, using only $2^{10}$ levels. This represents a reduction in complexity of ~64×. Note, however, that the cost is that the data-rate is now 2× faster. After being converted into the analog domain, the signal is then filtered by an anti-aliasing low-pass filter 18 to re-construct the digital signal.

High-performance DACs that target applications with stringent linearity and noise requirements, along with wide signal bandwidths, typically have large power consumption and require significant area. One way to achieve the high-bandwidth and resolution is to use an over-sampled architecture. As described in relation to FIG. 1, instead of implementing a full N-bit DAC equal to the input data bus width, a delta-sigma modulator is employed to reduce the number of unique analog levels that the DAC needs to represent. Noise-shaping by the delta-sigma modulator suppresses the added quantization noise.

A drawback of the architecture of FIG. 1 is that the digital circuitry must operate at the over-sampled data rate. For example, if the required signal bandwidth is 300 MHz, and a 2× over-sampled architecture is desired, the DSM, DAC and all associated custom high-speed digital circuitry must run at >1.2 Gsps. Also, due to the large size and high-switching frequencies of these DACs, supply induced-noise can be a large source of spurious emissions and non-linearity in integrated radio systems.

It is desirable to provide a DAC architecture that eases at least one of these implementation difficulties while addressing the need for low spurious emissions and high-linearity.

BRIEF DESCRIPTION OF THE DRAWINGS

Embodiments of the present disclosure will now be described, by way of example only, with reference to the attached Figures.

FIGS. 10A and 10B illustrate non-overlap signals and a related circuit.

DETAILED DESCRIPTION

Figure 1:
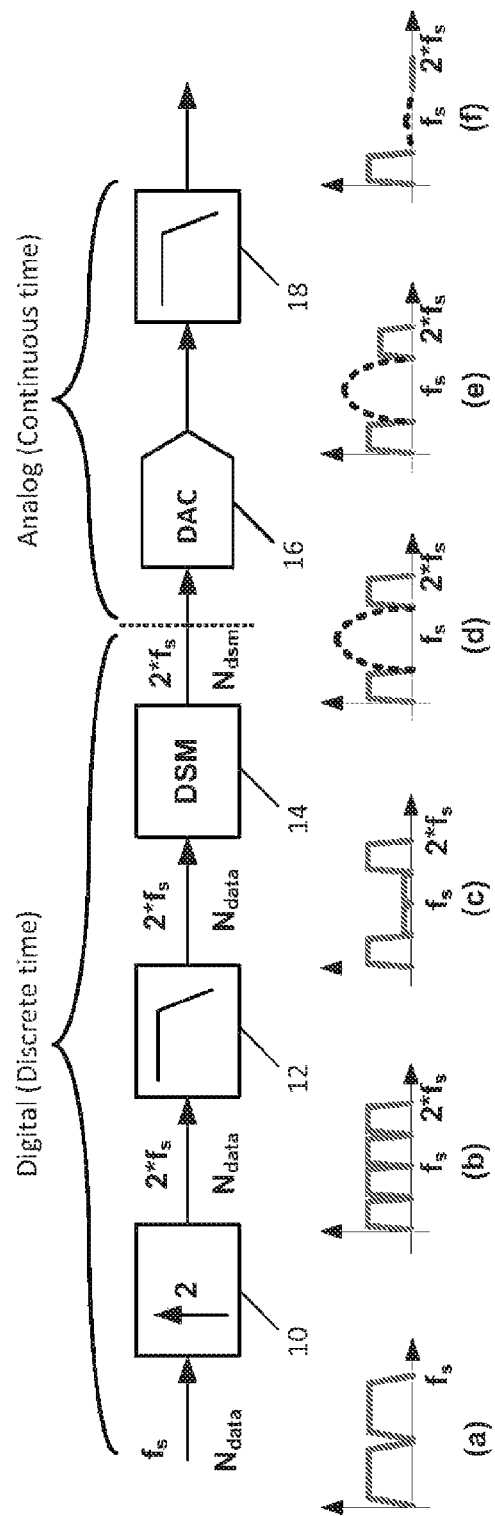
FIG. 1 illustrates a known oversampled digital to analog converter.

A method and apparatus for interleaving high-speed, delta-sigma based over-sampled DACs. High linearity DACs with high sample rates (>500 Msps) are often used for digitizing base-band and intermediate-frequency (IF) signals in wireless radio architectures. The linearity and noise requirements placed on these DACs are typically very stringent, and the requirement for high-signal bandwidth necessitates the use of high-sample rates. Using delta-sigma techniques and over-sampling can be used to reduce the in-band noise floor in these systems at the expense of even higher sample rates and potentially more power dissipation.

Embodiments of the present disclosure present a DAC architecture in which the delta-sigma modulator is decomposed into a parallel poly-phase block-filter running at a lower rate. The generated parallel digital data is then fed directly to the analog DAC output stage where it is directly combined to form the full-rate signal using a 1-hot-of-N output stage. By using a poly-phase implementation, the complexity of the high-speed parallel digital-analog timing interface is simplified, along with the timing requirements of the delta-sigma modulator which normally would have to run at the full-oversampled rate. The 1-hot-of-N signal encoding is directly generated from the parallel delta-sigma modulator, and efficiently encodes the data in such a way to minimize signal-dependent supply noise.

An architecture according to an embodiment of the present disclosure is useful for the practical implementation of high-speed over-sampled DACs as it allows the power-consuming high-speed data-path to run at a much lower rate without the use of a full-rate parallel-to-serial conversion stage (PISO). Data is instead interleaved directly in the analog domain in the final stage of the DAC. Minimizing data-dependent supply noise using 1-hot-of-N encoding yields superior linearity. The architecture disclosed is advantageous for the practical implementation of high-speed over-sampled DACs, such as those used in stringent wireless applications.

It is an object of the present disclosure to obviate or mitigate at least one disadvantage of previous DACs.

In an embodiment, the present disclosure provides a digital to analog conversion system comprising: a poly-phase digital filter providing parallel digital outputs; and a digital to analog converter. The DAC includes an analog multiplexer; and a plurality of data inputs configured to receive, as inputs to the DAC, the parallel digital outputs of the poly-phase digital filter such that the digital outputs are combined only in the analog domain.

In an example embodiment, the parallel digital outputs of the poly-phase digital filter are interleaved directly in the analog domain in a final stage of the DAC.

In an example embodiment, the unrecombined parallel digital outputs of the poly-phase digital filter are directly combined in the analog domain in the DAC instead of being used as an intermediate signal.

In an example embodiment, the poly-phase digital filter comprises an N-phase digital block filter directly connected to N-inputs of the multiplexing analog DAC.

In an example embodiment, the poly-phase digital filter comprises: a delta-sigma modulator (DSM) configured to noise-shape over-sampled data. In an example embodiment, the system further comprises: an additional digital filter cascaded with the DSM to perform additional digital signal conditioning functions. In an example embodiment, the additional digital filter is configured to perform interpolation, low-pass filtering, band-pass filtering, high-pass filtering, sin x/x correction, equalization, phase correction or DC offset correction.

In an example embodiment, the DAC further comprises: a 1-hot-of-N encoder configured to encode the outputs of the poly-phase digital filter in 1-hot-of-N signaling to produce 1-hot-of-N signals. In an example embodiment, the 1-hot-of-N signals are used to directly drive the analog multiplexer in the DAC.

In an example embodiment, the 1-hot-of-N encoder further comprises: a non-overlap signal generator configured to condition the analog 1-hot-of-N signals. In an example embodiment, the non-overlap signal generator is configured to generate non-overlap signals based on the 1-hot-of-N signals output by the 1-hot-of-N encoder.

In an example embodiment, the non-overlap signal generator comprises N parallel signal conditioning stages for an interleaving ratio of N. In an example embodiment, the N signal conditioning stages are cross-connected such that when a first signal is transitioning in one direction, a second signal transitioning in an opposite direction is delayed until the first transition is complete. In an example embodiment, the N signal conditioning stages are cross-connected such that when the first signal transitions from low to high, the second signal is delayed such that the second signal transition from high to low begins after the first signal transition is completed. In an example embodiment, the cross-connections produce a non-overlap period of a single inverter delay.

In another embodiment, the present disclosure provides a digital to analog conversion method comprising: providing a plurality of parallel digital outputs from a poly-phase digital filter; receiving, at a digital to analog converter, the parallel digital outputs of the poly-phase digital filter; and multiplexing, only in the analog domain, the parallel digital outputs of the poly-phase digital filter.

In an example embodiment, the method further comprises: interleaving the parallel digital outputs of the poly-phase digital filter directly in the analog domain in a final stage of the DAC. In an example embodiment, the method further comprises: directly combining, in the analog domain in the DAC, unrecombined parallel digital outputs of the poly-phase digital filter. In an example embodiment, the digital outputs are used directly as inputs to the DAC instead of as intermediate signals requiring digital recombination.

In a further embodiment, the present disclosure provides an digital to analog conversion method comprising: receiving, directly at a digital to analog converter (DAC), parallel digital outputs of a poly-phase digital filter such that the digital outputs are combined only in the analog domain; and directly combining, in the analog domain in the DAC, unrecombined parallel digital outputs of the poly-phase digital filter.

In an example embodiment, the digital outputs of the poly-phase digital filter are used directly as inputs to the DAC instead of as intermediate signals requiring digital recombination.

In another embodiment, the present disclosure provides a digital to analog converter comprising: an analog multiplexer; and a plurality of data inputs configured to receive, as inputs to the DAC, parallel digital outputs of a poly-phase digital filter. The DAC is configured to directly combine, only in the analog domain in the DAC, unrecombined parallel digital outputs of the poly-phase digital filter.

In an example embodiment, the present disclosure provides an interleaved, poly-phase, delta-sigma over-sampled DAC architecture using a 1-hot-of-N analog output stage.

Other aspects and features of the present disclosure will become apparent to those ordinarily skilled in the art upon review of the following description of specific embodiments in conjunction with the accompanying figures.

Some existing implementations of "interleaved DACs" are represented by the following public domain publications, each of which is incorporated by reference in its entirety: S. Park et al., "A digital-to-analog converer based on differential-quad switching," IEEE Journal of Solid-State Circuits, vol. 37, no. 10, October 2002; J. Pham et al., "A time-interleaved ΔΣ-DAC architecture clocked at the nyquist rate," IEEE Transactions on Circuits and Systems-II: Express Briefs, vol. 55, no. 9, September 2008; W. Schofield et al, "A 16b 400 Ms/s DAC with <−80 dBc IMd to 300 MHz and <−160 dBm/Hz noise power spectral density," IEEE International Solid-state circuits conference, 2003; U.S. Pat. No. 6,977,602: "Wide-band digital to analog converters and methods, including converters with selectable impulse response"; U.S. Pat. No. 7,679,538: "Current steering type digital-to-analog converter"; U.S. Pat. No. 7,312,737: "Bandwidth enhancement by time interleaving multiple digital to analog converters"; U.S. Pat. No. 6,218,974: "Data multiplexing in mixed-signal circuitry"; and U.S. Pat. No. 6,621, 437: "Multiplexed digital-to-analog converters used in communication devices".

Figure 2:
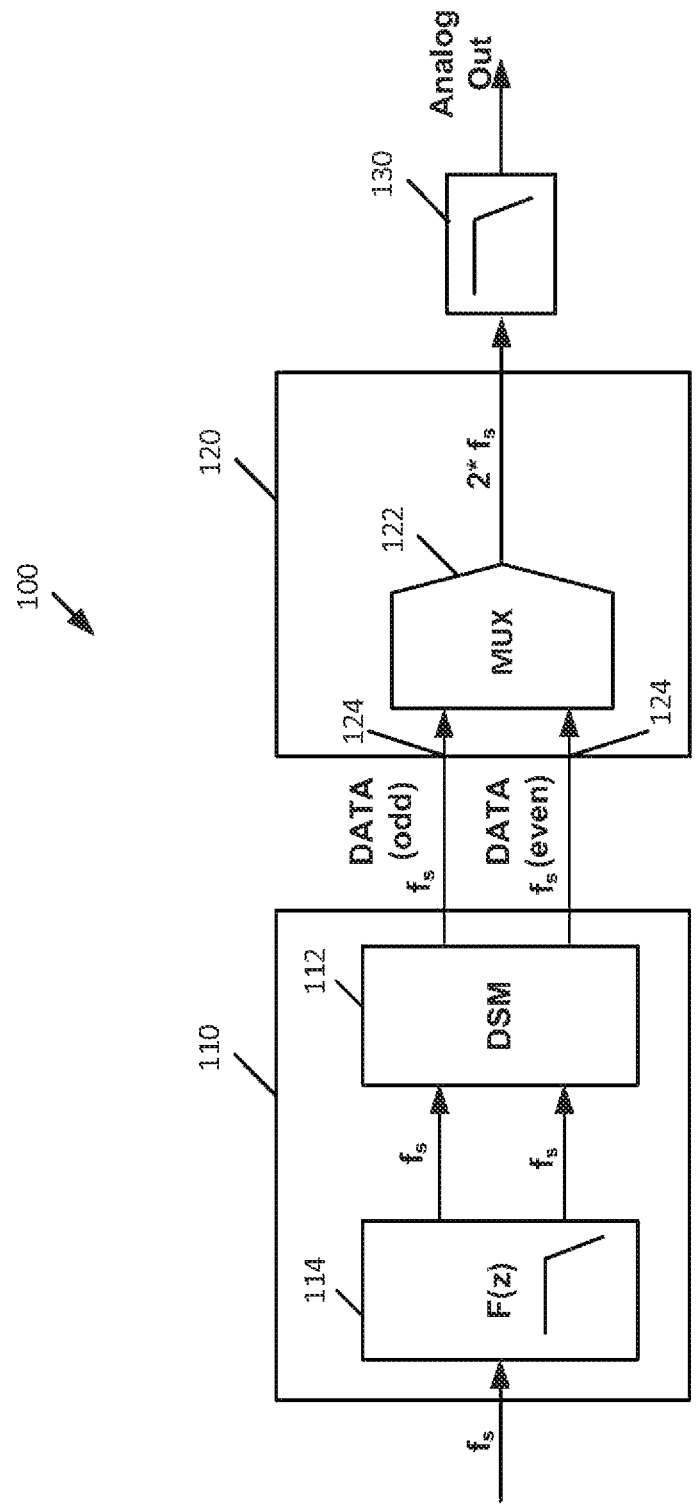
FIG. 2 is a block diagram of a DAC architecture according to an embodiment of the present disclosure.

FIG. 2 is a block diagram of a DAC architecture according to an embodiment of the present disclosure. The example embodiment in FIG. 2 seeks to ease some of the practical design difficulties encountered in the over-sampled system described in FIG. 1 by combining two techniques: 1) poly-phase block filtering; and 2) analog multiplexing of interleaved data, such as by using 1-hot-of-N encoding. As is known in the art, 1-hot-of N refers to an approach in which only 1 out of N signals is "hot", or non-zero, at a given time. Embodiments implementing the 1-hot-of-N encoding will be described later with respect to FIGS. 6-13.

Referring back to the embodiment of FIG. 2, a digital to analog conversion system 100 is provided comprising: a poly-phase digital filter 110 providing parallel digital outputs; and a digital to analog converter (DAC) 120. The DAC 120 includes an analog multiplexer 122 and a plurality of data inputs 124. The plurality of data inputs 124 are configured to receive, as inputs to the DAC, the parallel digital outputs of the poly-phase digital filter such that the digital outputs are combined only in the analog domain. An anti-aliasing filter 130 is also shown at the output of the DAC.

In the example embodiment of FIG. 2, the poly-phase digital filter 110 comprises a delta-sigma modulator (DSM) 112 configured to noise-shape over-sampled data. In an embodiment, the DSM 112 is configured to reduce the word size of received over-sampled data and shape quantization noise. In an example embodiment, the DSM 112 truncates the sample word length.

In an example embodiment, the filter 110 further comprises an additional digital filter 114 cascaded with the DSM 112 to perform additional digital signal conditioning functions such as, for example, interpolation, low-pass filtering, band-pass filtering, high-pass filtering, sin x/x correction, equalization, phase correction or DC offset correction.

In an embodiment, this poly-phase filter is running at half the speed, and the interface between the digital and analog is also running at half the speed. In an embodiment, the actual analog DAC is used to recombine those poly-phase data signals at the last stage of the DAC. In such an example embodiment, the analog DAC is being used as a MUX.

Further details will now be provided with respect to some of the concepts introduced in the system of FIG. 2.
Poly-Phase Filter Based DSM Any digital FIR filter can be decomposed into a poly-phase representation. This is done by de-constructing the original filter into several parallel paths that sub-sample the original FIR filter impulse response. If the filter is decomposed into N parallel paths, each of the paths will effectively run at 1/N of the original sample rate. Representing the original single-input, single-output (SISO) digital filter in the z-domain as H(z), the new parallel filter can be expressed as the sum of several smaller filters:

$$H(z) = \sum_{k=0}^{N-1} z^{-k} I_k(z^N)$$

where the parallel components of the filter are calculated as:

$$I_k(z) = \sum_{j=-\infty}^{\infty} h(N \cdot j + k) z^{-j}$$

Here h(n) are the coefficients of the original filter impulse response. An example of the evolution of a full-rate FIR filter to a poly-phase implementation is shown in the representations in FIGS. 3A to 3D.

Figure 3A:
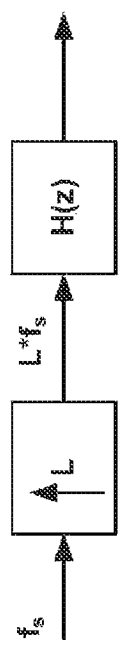
FIGS. 3A to 3D illustrate different representations of a poly-phase filter.
Figure 3B:
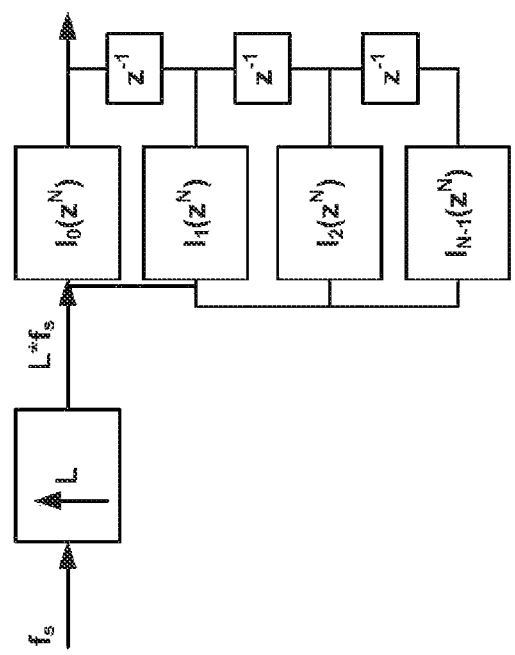
Figure 3C:
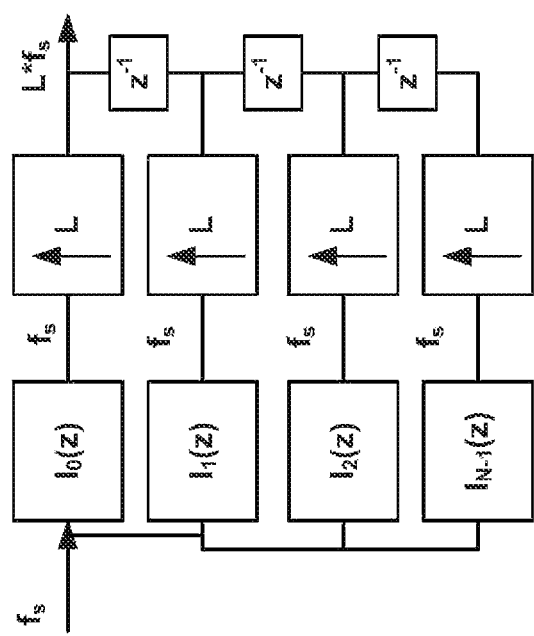
Figure 3D:
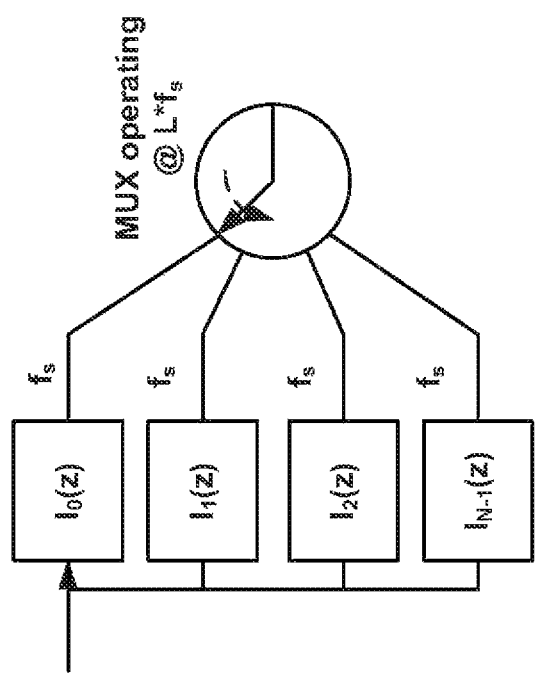

In FIG. 3A, the input data is first up-sampled by a factor of L before being input to the poly-phase filter representation in FIG. 3B. Moving the up-sampling process to after the poly-phase decomposition leads to the structure in FIG. 3C. From this form it is clear that the final operation after the parallel filtering is merely an up-sample and delayed-sum, which can be simply implemented as a rotating MUX function, as shown in FIG. 3D, that operates at the full sample rate of $L*f_s$. Note that all sub-filters are now running at the original sample rate $f_s$ instead of running at the full output rate of $L*f_s$.

A practical and important extension of poly-phase decomposition is the creation of digital "block filters." This type of filter makes use of the poly-phase decomposition to filter blocks of sequential data in parallel. In this case, the block filter input-output transfer function would be:

$$\overline{Y}(z) = \overline{H}(z)\overline{X}(z)$$

where, $$\overline{y}(n) = [y(nN) y(nN+1) \ldots y(nN+N-1)]^T$$

$$\overline{x}(n) = [x(nN) x(nN+1) \ldots x(nN+N-1)]^T$$

In other words, the input to a block filter $\overline{H}(z)$ is vector that contains a block of consecutive input data samples to the single-input system. Derivation of the coefficients of the digital block filter can be shown to be:

$$\overline{H}(z) = \begin{bmatrix} I_0 & I_1 & I_2 & \ldots & I_{N-1} \\ z^{-1}I_{N-1} & I_0 & I_1 & \ldots & I_{N-2} \\ \vdots & \vdots & \vdots & \vdots & \vdots \\ z^{-1}I_1 & z^{-1}I_2 & z^{-1}I_3 & \ldots & I_0 \end{bmatrix}$$

Note that the first row is simply the poly-phase decomposition of the original FIR filter H(z).

Figure 4:
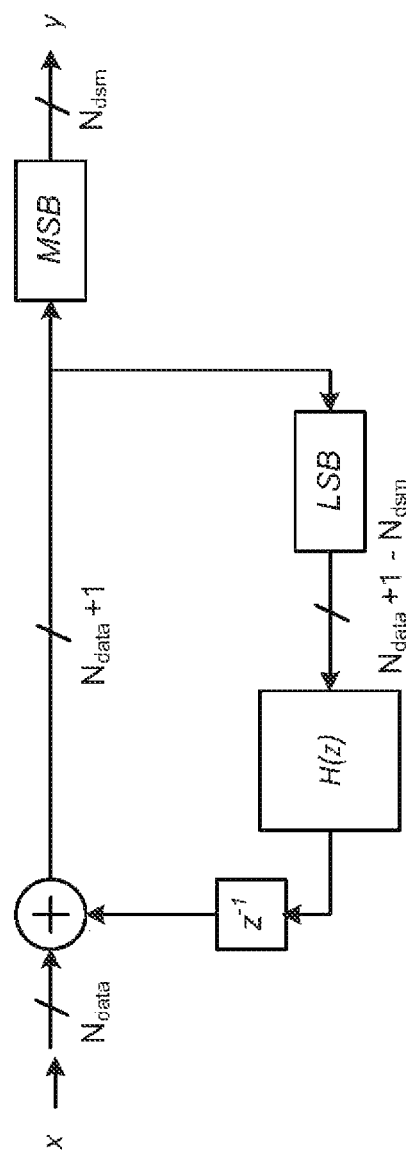
FIG. 4 is a block diagram of a known error-feedback delta-sigma modulator.

This technique can also be applied to delta-sigma modulators as well as simple digital filters in order to reduce the speed of internal circuitry.
Poly-Phase Delta-Sigma Modulator The most practical implementation of a digital DSM when used for D/A conversion is the error-feedback form (EFB). The EFB structure feeds back the error generated by truncating the input data and passes it through a FIR filter to shape the added quantization noise as shown in FIG. 4.

Working out the transfer function from input to output yields:

$$Y(z) = X(z) + [1 - H(z)]E(z)$$

where e[n] is the truncation error introduced by the loop. H(z) is generally chosen to have a high-pass frequency response in order to suppress in-band noise of the DAC, and move the added power to higher frequencies where it can be filtered out at a later stage. Since the noise shaper is effectively a single FIR filter in a feedback loop, the system can also take advantage of poly-phase decomposition to ease implementation timing requirements.

Figure 5:
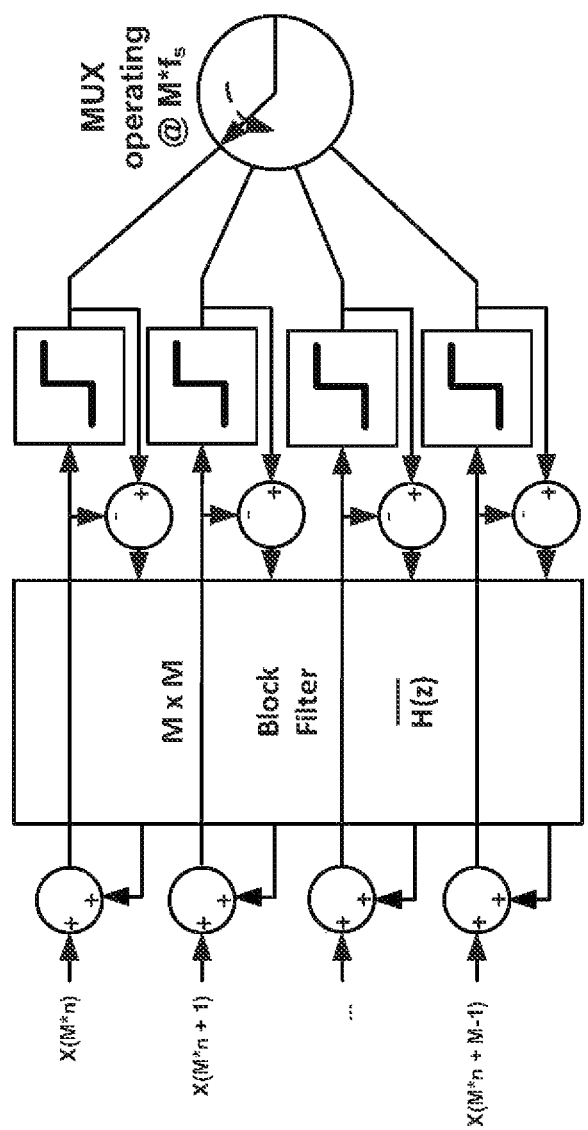
FIG. 5 illustrates a poly-phase DSM implementation.

By using the block filtering approach the delta-sigma modulator can be converted to its parallel poly-phase form to yield the structure shown in FIG. 5.

As illustrated in FIG. 5, the comparator block is used to illustrate the truncation function. The poly-phase DSM implementation, such as can be implemented in the DSM 112 in FIG. 2, shows that by considering the input data in sequential blocks, the data can be easily processed in parallel. The output of the DSM is M parallel data-streams running at $1/M^{th}$ the output rate. Since this parallel data is now running at a lower rate, the required power to deliver this data to the analog DAC is reduced along with the timing requirements for any subsequent digital logic. This is a significant advantage when designing high-speed, high-resolution DACs used in wireless applications where sample rate requirements can be greater than 600 Msps.

As shown in FIG. 5, to complete the poly-phase re-construction, a MUX is required to time-interleave the output data of the DSM. If this MUX were to be done in the digital domain before sending the data to the analog DAC, a significant part of the advantage of the poly-phase approach would be lost.

In an embodiment of the present disclosure, this parallel data is instead routed as an interleaved parallel data bus to the final stage of the analog DAC where it is re-combined directly using a 1-hot-of-N output stage. This avoids the requirement for a separate power-consuming digital PISO.

As described earlier, a DAC architecture according to an embodiment of the present disclosure seeks to ease some of the practical design difficulties encountered in the over-sampled DAC described in FIG. 1 by combining the two techniques of poly-phase digital block-filtering, and analog MUXing of interleaved poly-phase data using 1-hot-of-N encoding.

Figure 6:
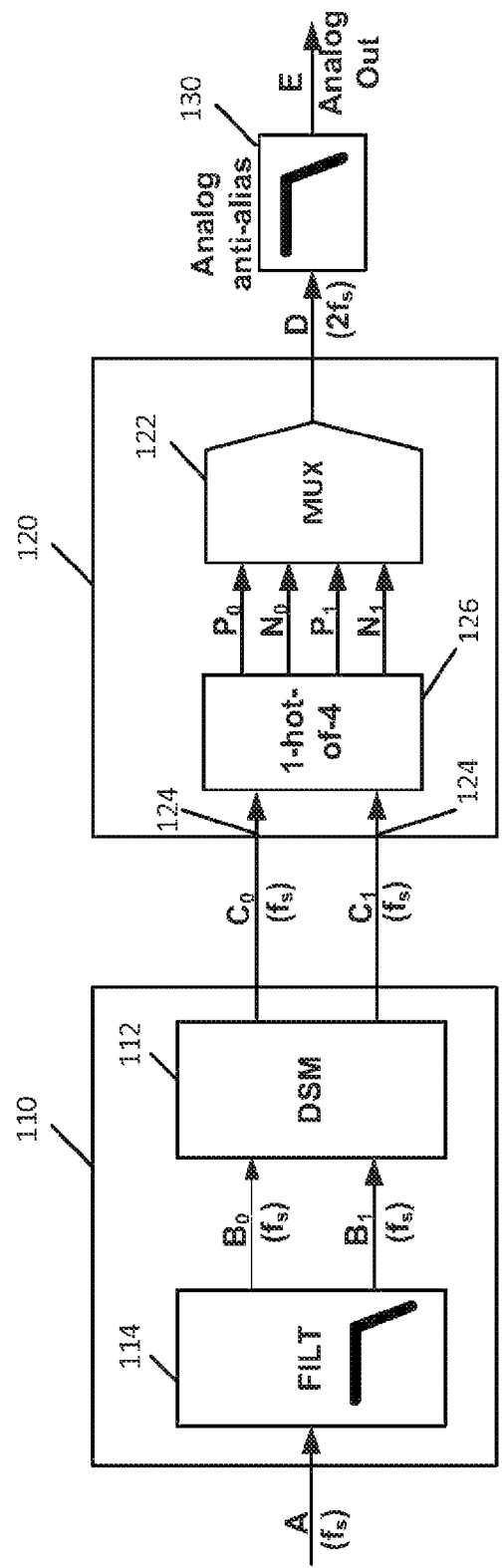
FIG. 6 illustrates a block diagram of a DAC architecture according to an embodiment of the present disclosure.

FIG. 6 illustrates a block diagram of a DAC architecture according to an embodiment of the present disclosure. The following description describes a particular embodiment of the DAC architecture, or DAC system, with an over-sample ratio of 2×, with two parallel inputs as shown in FIG. 6.

The input data (A) to the DAC system 100 first feeds a poly-phase implementation 110 of both the delta-sigma modulator (DSM) 112 and a digital filter (FILT) 114. This added filter 114 can realize any number of signal conditioning functions and can be efficiently cascaded with the DSM 112 as shown in FIG. 6. Since this is an over-sampled architecture this will typically include an anti-aliasing filter to attenuate images after interpolation. It may also include any number of other signal conditioning functions such as $\sin(x)/(x)$ loss compensation or signal path equalization. After filtering (B) the data is noise shaped by the poly-phase DSM (C) to produce two new data signals (one for each path of the poly-phase filter) at the inputs 124 of the DAC 120. Calculation of the poly-phase components of such a DSM and filter bank have already been illustrated in FIG. 5 and FIG. 3D, respectively, and described in relation thereto.

Note that the two separate output busses (C0 and C1) from the filter bank are both running at the input data rate, instead of the over-sampled rate of $2f_s$. Following noise shaping, the interleaved data is directly encoded into a 1-hot-of-4 signaling scheme using a single logical AND function:

$$P_0 = C_0 \cdot CLK$$

$$N_0 = \overline{C_0} \cdot CLK$$

$$P_1 = C_1 \cdot \overline{CLK}$$

$$N_1 = \overline{C_1} \cdot \overline{CLK}$$

where CLK is a clock-signal running at the input rate ($f_s$). After encoding, the data is then routed to the CML MUX output stage shown in FIG. 8B where it is converted into an analog output. The novel non-overlap generator shown in FIG. 9 can be used to drive these signals to improve linearity of the DAC. As described earlier, this delay helps to improve the switching characteristics of the CML output stage when being driven by CMOS levels.

A DAC according to an embodiment of the present disclosure avoids recombining the poly-phase digital outputs into a full rate output before feeding into the DAC. Instead, the poly-phase outputs are taken from the digital and being directly fed into the DAC. In an example embodiment, the recombination is being performed completely in the analog domain taking advantage of the 1-hot-of-4, or DQS coding in order to do that.

According to an embodiment of the present disclosure, a poly-phase digital filter output is being used directly without having to recombine it digitally. The poly-phase filter digital output is typically an intermediate signal that is not used on its own. According to an embodiment of the present disclosure, the poly-phase digital output is fed directly into analog, free from any digital recombination before it is provided to the analog circuit. In an example embodiment, this includes a 1-hot-of-N DAC structure to do the combination which, when N=4 is DQS.

Embodiments of the present disclosure use the parallel output of the poly-phase filter as an input. Those signals are typically not used in this way, and are typically recombined with the delayed MUX before using the output signal, such as illustrated in FIG. 3D, to be described later.

Embodiments of the present disclosure take advantage of an observation that there is an even/odd pattern occurring in the MUX as well as in the DQS. According to an embodiment of the present disclosure, that even/odd pattern is removed and signals are left in parallel domains. From that scenario, embodiments of the present disclosure are expanded to higher order scenarios, taking advantage of the observed even/odd pattern in the DQS, and at the poly-phase. According to an embodiment of the present disclosure, since these even/odd relationships are equal and opposite, they would cancel each other out when using the herein-disclosed architecture.

According to an embodiment of the present disclosure, intermediate values from a poly-phase digital DSP circuit are used them directly as input to a DAC, or a 1-hot-of-N module which then drives the DAC.

1-Hot-of-N Output Stage

Figure 7:
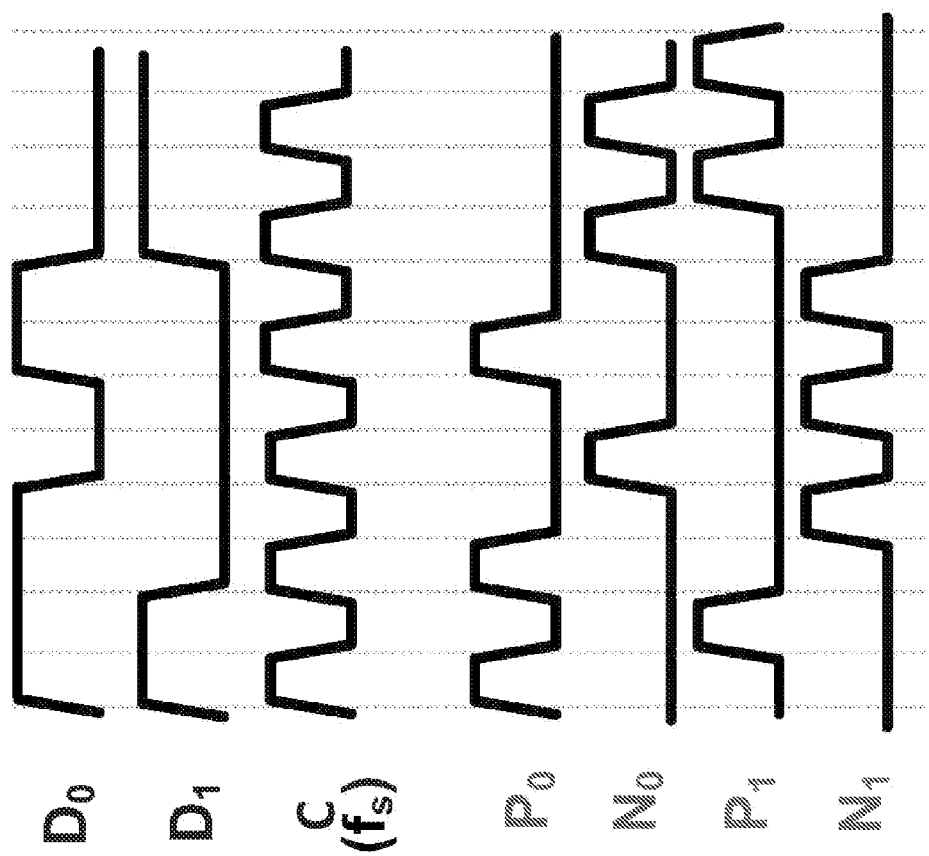
FIG. 7 illustrates an example of 1-hot-of-4 encoding.

In an embodiment, the interleaved data is recombined to form the final analog output signal. In an example embodiment, this recombination is performed using a 1-hot-of-N encoding scheme, such as a 1-hot-of-4 encoder 126 in FIG. 6, that can be directly generated from the parallel data output of the poly-phase DSM. The specific case of a 1-hot-of-4 output stage is also referred to as DQS. Note, however, that this can be extended to 1-hot-of-N, as will be described later in relation to FIG. 11. An example of signals using 1-hot-of-4 encoding is shown in FIG. 7 for data that has been generated from a 2× interleaved poly-phase DSM.

In this example, the four output signals that make up the 1-hot-of-4 encoding are generated from the poly-phase DSM outputs ($D_0/D_1$) using a single logical AND function:

$$P_0 = D_0 \cdot C$$
$$N_0 = \overline{D_0} \cdot C$$
$$P_1 = D_1 \cdot \overline{C}$$
$$N_1 = \overline{D_1} \cdot \overline{C}$$

where C is a half-rate clock. From the above signals, it is clear that only one signal is "high" in any given cycle of the full-rate clock. This type of encoding also has the advantage that after every bit period there is both a rising and falling transition. Thus, any power supply noise generated by these signals will be data-independent which helps to improve overall DAC linearity.

Due to the large size and high-switching frequencies of high-resolution DACs, supply induced-noise can be a large source of spurious emissions and non-linearity in integrated radio systems. The 1-hot-of-N encoding ensures that any supply noise generated by the DAC is signal-independent which significantly improves the overall linearity of the system.

Figure 8A:
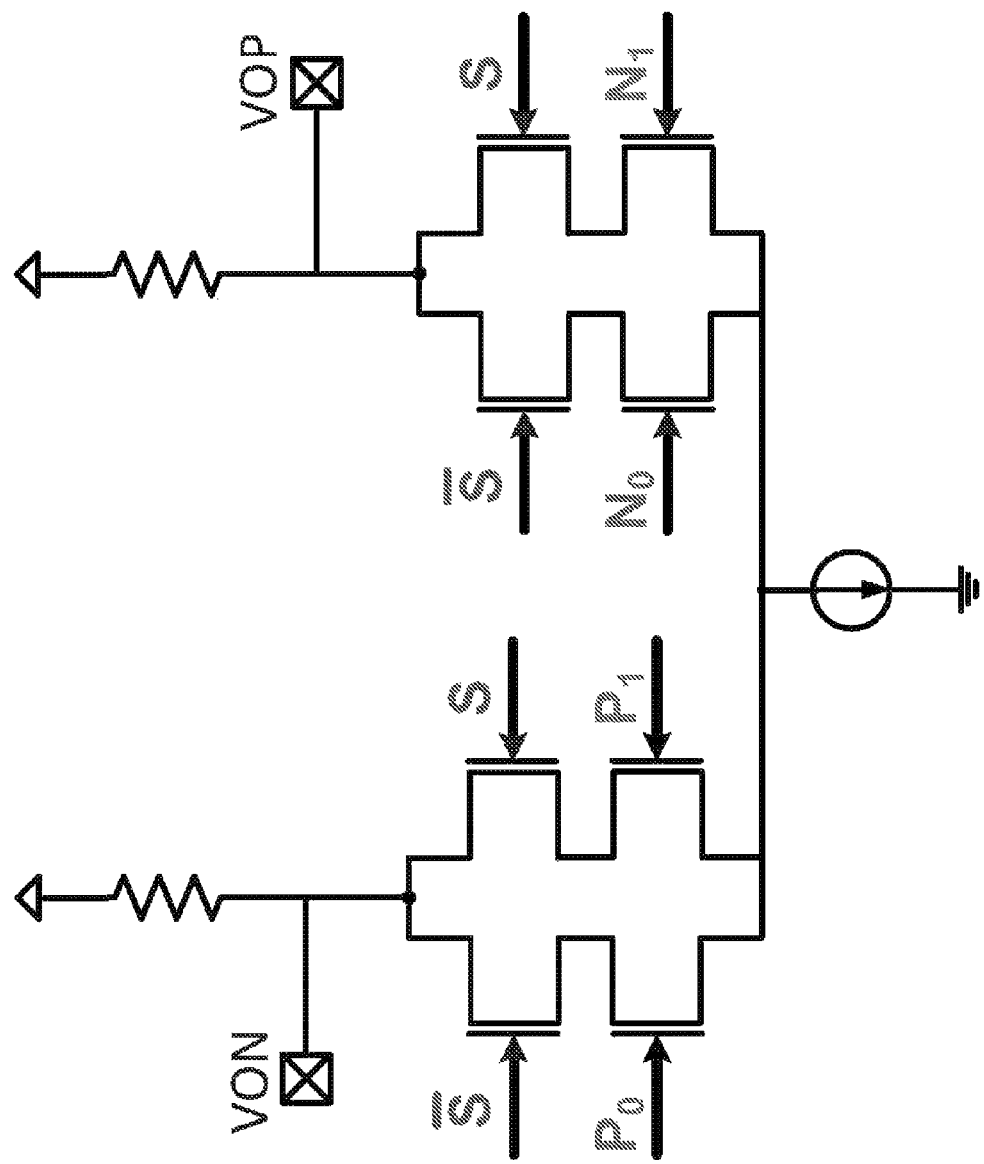
FIGS. 8A and 8B illustrate representations of a common-mode logic based multiplexer.
Figure 8B:
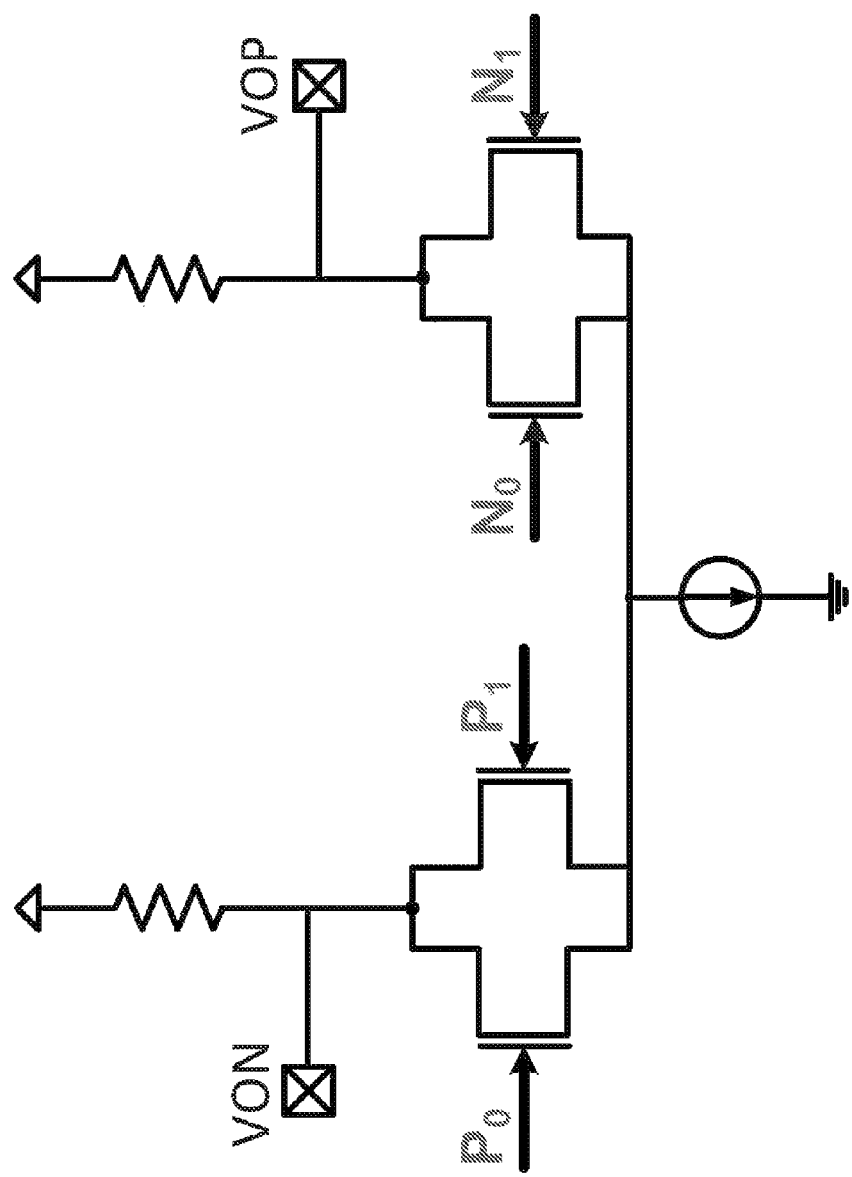

FIGS. 8A and 8B illustrate representations of a common-mode logic based multiplexer. Another advantage of this type of encoding is that it can be used to drive a very efficient common-mode logic (CML) based MUX. A typical CML MUX is shown in FIG. 8A, along with its simplified 1-hot-of-4 version in FIG. 8B. Note that with 1-hot-of-4 encoding the simplified MUX does not need the extra switches to select (S) between input $P_0/N_0$ and $P_1/N_1$.

Another advantage of this type of encoding is the voltage seen at the common source node of the current steering devices has no signal-dependent content. In every current steering structure, the common-source node sees a voltage transient every time the data transitions, and this voltage transient, combined with the capacitance of this node and non-idealities of the current source and the current steering devices creates a current transient at the output. In a conventionally-coded DAC, this current transient may be data-dependent and create distortion at the output, whereas in a 1-hot-of-N coded DAC, this current transient is made data-independent.

1-Hot-of-N Non-Overlapping Signal Generator

Since most high-performance DACs are implemented in CMOS, the digital data signal must first be converted to signal levels that are appropriate to drive a CML output stage as shown in FIG. 8B.

Figure 9:
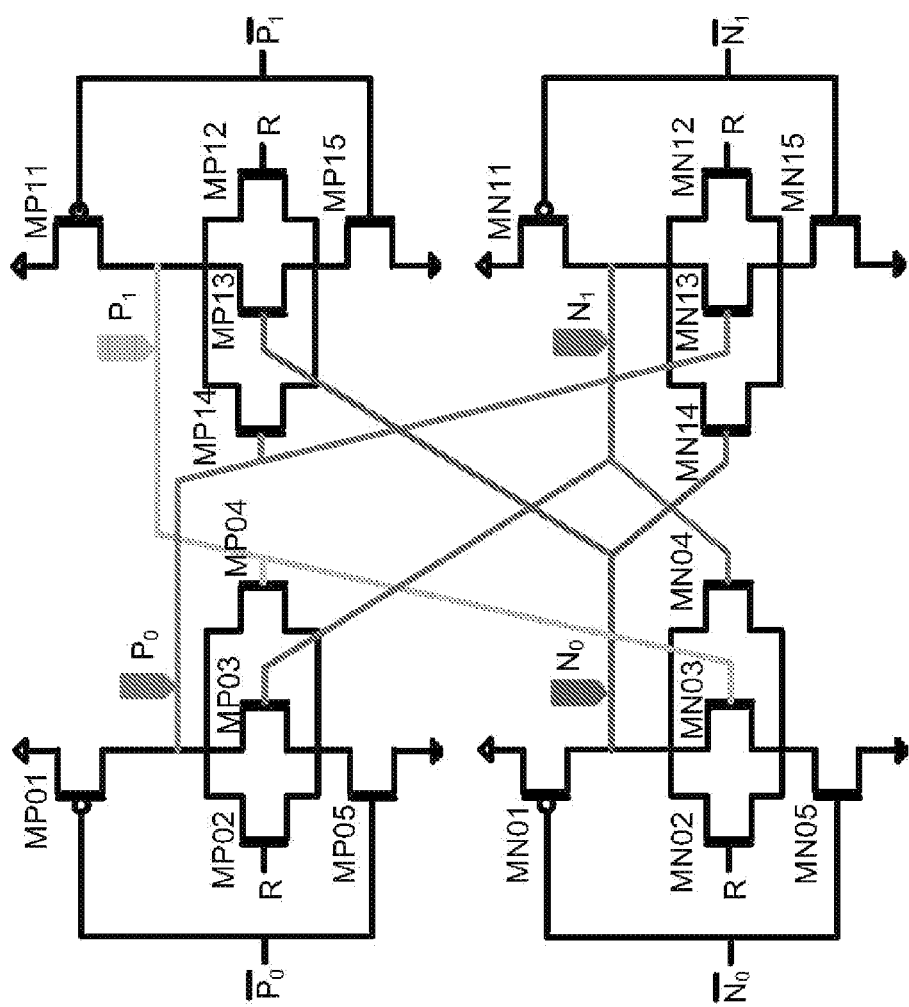
FIG. 9 illustrates a 1-hot-of-4 non-overlapping signal generator.

Included in an embodiment of the present disclosure is a novel 1-hot-of-N non-overlapping signal generator. In an example embodiment, the 1-hot-of-N encoder 126 in FIG. 6 or FIG. 11 further comprises a non-overlap signal generator configured to condition the analog 1-hot-of-N signals. In an example embodiment, the non-overlap signal generator is configured to generate non-overlap signals based on the 1-hot-of-N signals output by the 1-hot-of-N encoder. An example of this circuit for the case of an over-sample ratio of 2× is shown in FIG. 9. It performs both the function of modifying the threshold crossing of $P_0/N_0$ $P_1/N_1$ and buffering the input data. Most known non-overlapping signal generators start by dealing with two signals at a time. In contrast, the non-overlapping signal generator of FIG. 9 deals with 4 at a time and can also be expanded as in FIG. 13.

In an example embodiment, the non-overlap signal generator comprises N parallel signal conditioning stages for an interleaving ratio of N. The circuit of FIG. 9 creates a non-overlap period between the rising and falling signal and buffers the 1-hot-of-4 drive signals. As described above, every clock cycle one of these signals will transition to the "low" state and one will transition to the "high" state. This circuit is cross-coupled in such a way that a transition from low-to-high will always occur first, followed by the high-to-low transition. In another embodiment, the circuit is cross-coupled such that when a first signal is transitioning in one direction, a second signal transitioning in an opposite direction is delayed until the first transition is complete. The effective non-overlap period is only a single inverter delay and thus this circuit can operate up to very high-speeds. The extra signal R is used during reset to define the initial state of the circuit and during operation this reset signal is held low. An example of a transition of $P_1$ from low-to-high is shown in FIG. 10A.

In FIG. 10A, $P_1$ initially transitions from low-to-high through the PMOS MP11 in FIG. 9. Once the voltage of $P_1$ increases beyond the threshold of NMOS MP04 in FIG. 9, the pull-down path is enabled and the signal $P_1$ is discharged to the low-state. The cross-coupling between all signals ensures that the rising-before-falling transition will always occur for every possible combination of states. The advantage of the non-overlap period is that these signals can be used to directly drive a CML output state as shown in FIG. 6B since the common-mode is effectively moved closer to the supply voltage. If complementary CMOS signals were to drive this differential pair directly, there would occur a time when both NMOS are turned off. This results in a dip at the drain of the current source, resulting in higher non-linear distortion in the DAC output signal. Using the non-overlap signal ensures a make-before-break transition so that the current-source drain-voltage does not experience a significant disturbance during a switching event. Such a circuit is integral to obtaining the high-linearity at the high-sample rates required for DACs targeting stringent wireless applications. Note that this circuit can easily be extended to the general case of 1-hot-of-N encoding as described later in this disclosure.

The embodiment in FIG. 9, and described in relation to FIGS. 10A and 10B, considers that, in a 1-hot-of-N encoder, in every transition one signal will go high and one signal will go low. The cross-connections in FIG. 9 ensure that when one signal goes high, the next signal will not go low until the first signal has completed its transition. In another embodiment, the cross-connections ensure that when one signal goes low, the next signal will not go high until the first signal has completed its transition. In such embodiments, each of the cross-connected units ensures that when a signal is transitioning in one direction, the other signal transitioning in the other direction is delayed until the first transition is complete.

Figure 11:
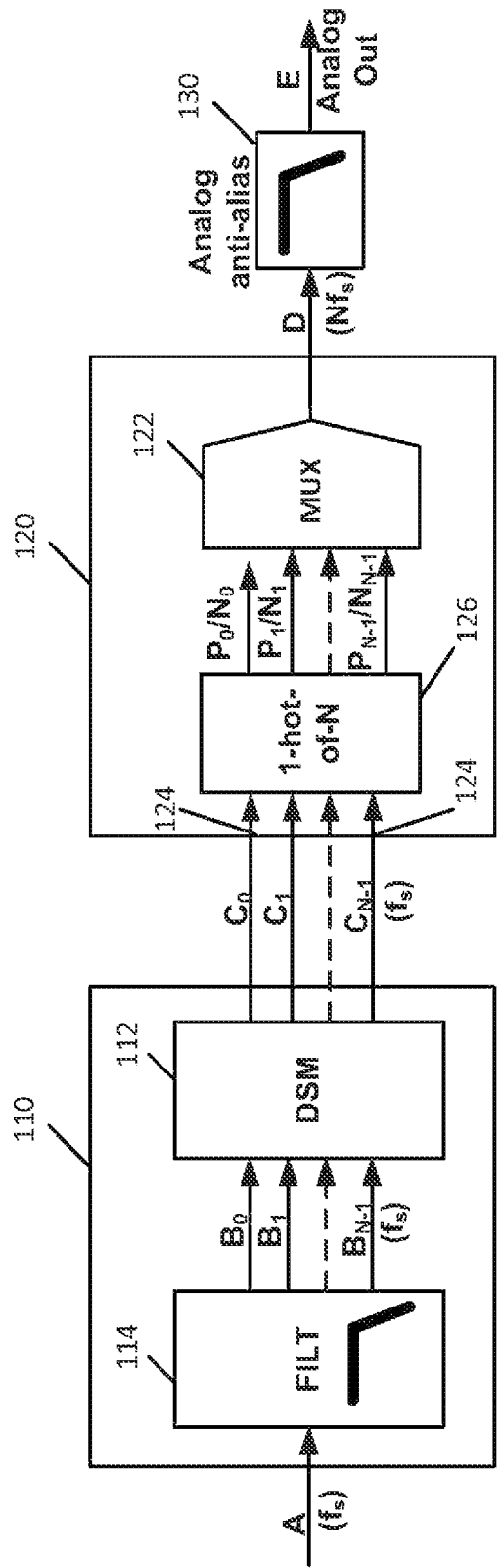
FIG. 11 illustrates a block diagram of a DAC architecture according to another embodiment of the present disclosure.

FIG. 11 illustrates a block diagram of a DAC architecture according to another embodiment of the present disclosure. The embodiment of FIG. 11 generalizes the embodiment of FIG. 6 to N inputs. The DAC architecture need not be limited to an over-sample ratio of 2×, and can be expanded to include a poly-phase filter of any arbitrary number of parallel paths. In this case, the over-sampling ratio is N, and therefore there will be N individual outputs of the DSM, which is then encoded in 1-hot-of-N signaling. This then drives an integrated N-input MUX output stage.

Figure 12:
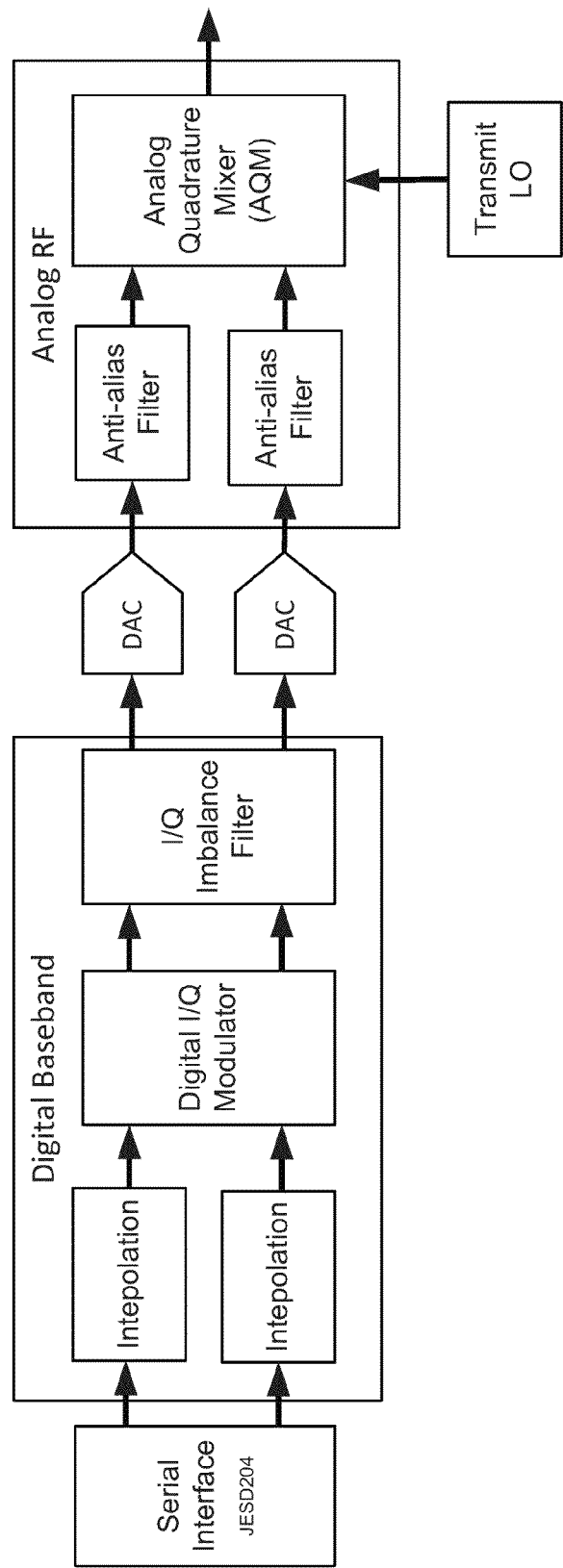
FIG. 12 illustrates an implementation of a DAC according to an embodiment of the present disclosure in a complex-IF system.

FIG. 12 illustrates an embodiment used in a high-performance wireless transmit path. This example shows a complex-IF system where one DAC is used for each if the I-Q data paths. Here serial data is received by the system though a high-speed interface such as JESD204 and sent to the baseband portion of the transmit path. Here the data passes through several optional interpolation stages to increase the sample rate, and is then digitally modulated to a higher intermediate frequency (IF). This data is then corrected for I/O imbalance before being sent to the DAC. As described previously, the DAC can also contain any number of signal conditioning filters such as equalization or DC offset correction. The modulated I/O data is converted into an analog signal and then translated to RF using an analog mixer (AQM) which is clocked by a RF local oscillator (LO).

The example shown above is only one example embodiment of the present disclosure. This DAC can be used in any system that requires analog-to-digital conversion; however, it is particularly advantageous in high-performance systems that simultaneously require high-signal bandwidth, high-resolution and very good linearity and noise characteristics.

Figure 13:
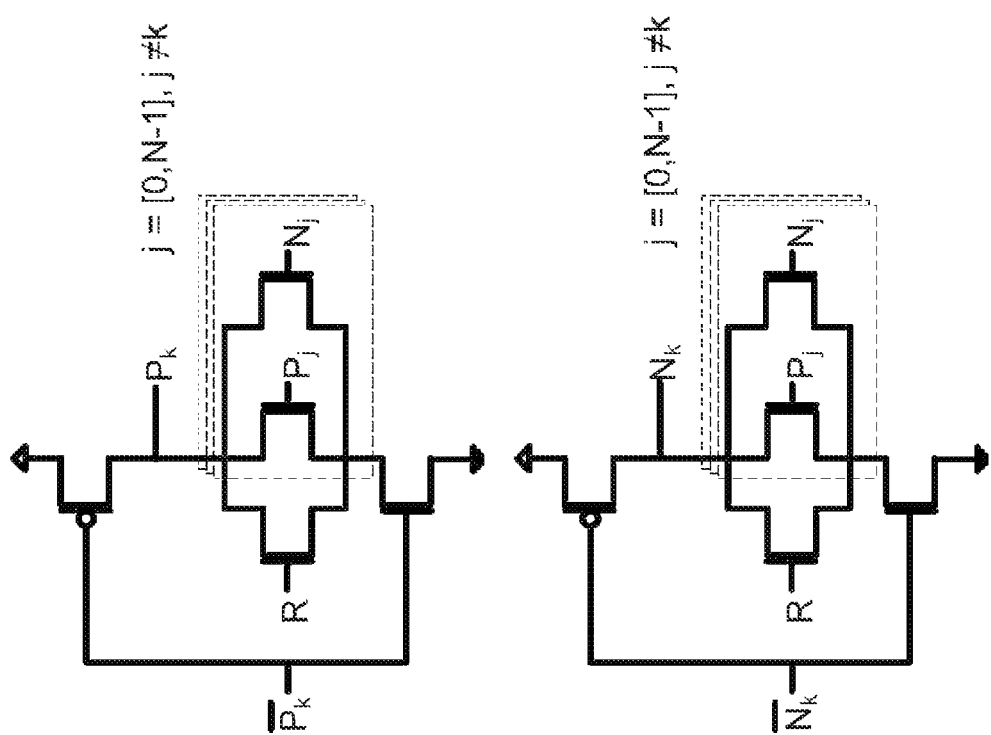
FIG. 13 illustrates a generalized 1-hot-of-N encoder according to an embodiment of the present disclosure.

FIG. 13 illustrates a generalized 1-hot-of-N encoder according to an embodiment of the present disclosure.

Embodiments of the present disclosure ease the implementation requirements for high-bandwidth, over-sampled DACs. Over-sampled DACs can be used to reduce the complexity of the analog circuitry at the expense of a higher sample rate. By using a completely interleaved approach using poly-phase filters, the entire data path can run at a much lower rate and still benefit from the advantages of DSM noise-shaping and 1-hot-of-N encoding. The alternative to this architecture would be running the entire data-path (including DSM) at the full over-sampled rate. This would not only require more power as the limits of the physical technology are approached, but the implementation challenges are significantly higher to design digital blocks that run at this elevated rate. Another advantage of this architecture is that it achieves superior linearity by efficiently integrating 1-hot-of-N encoding to reduce signal dependent supply noise. Supply noise coupling and spurious emissions are a significant design challenge to fully integrated wireless systems.

These DACs can be used in any application requiring high sample rates such as multi-mode wireless base-stations transmitters. In these cases, the DAC must be able to simultaneously support GSM, W-CDMA, LTE and potentially several other standards. Supporting several of these standards simultaneously requires strict emission, linearity and noise requirements.

In an embodiment, the present disclosure provides an N-phase implementation of a digital block filter directly connected to the N-inputs of a multiplexing analog DAC. The digital filter can comprise a delta-sigma modulator to noise-shape the over-sampled data. Any number of other digital filters can be cascaded with the DSM to perform other digital signal conditioning functions such as (but not limited to) sin x/x correction, equalization, or DC offset correction. In an embodiment, these are digital signal conditioning functions performed on the actual DAC data stream, as opposed to analog signal conditioning. The outputs of the poly-phase DSM can subsequently be encoded in 1-hot-of-N signaling. The 1-hot-of-N signals can be used to directly drive a multiplexing analog DAC output stage.

In an embodiment, the multiplexing DAC is implemented in the simplified CML MUX stage as shown in FIG. 8B. For the minimum interleave ratio of 2×, the CML MUX would have 4 signals as inputs. In the general case of an Nx interleave ratio, the CML MUX would have 2N input signals.

In another embodiment, the analog 1-hot-of-N CMOS signals are conditioned using the non-overlap signal generator shown in FIG. 13. This structure can be used to generate non-overlap signals generated by any N-phase block filter. In an example embodiment, for an interleaving ratio of N, there will be N instantiations of the circuit in FIG. 13, where k=[0, N−1]. For each of these instantiations cross-connection to the other units can be done for all signals Pj/Nj where j≠k.

Embodiments of the present disclosure relate to any DAC that is required to synthesize high-bandwidth, high-resolution signals while maintaining very good noise and linearity. They are particularly suited to multi-mode base-station transmitters where noise and linearity specifications are particularly stringent.

In the preceding description, for purposes of explanation, numerous details are set forth in order to provide a thorough understanding of the embodiments. However, it will be apparent to one skilled in the art that these specific details are not required. In other instances, well-known electrical structures and circuits are shown in block diagram form in order not to obscure the understanding. For example, specific details are not provided as to whether the embodiments described herein are implemented as a software routine, hardware circuit, firmware, or a combination thereof.

Embodiments of the disclosure can be represented as a computer program product stored in a machine-readable medium (also referred to as a computer-readable medium, a processor-readable medium, or a computer usable medium having a computer-readable program code embodied therein). The machine-readable medium can be any suitable tangible, non-transitory medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the disclosure. Those of ordinary skill in the art will appreciate that other instructions and operations necessary to implement the described implementations can also be stored on the machine-readable medium. The instructions stored on the machine-readable medium can be executed by a processor or other suitable processing device, and can interface with circuitry to perform the described tasks.

The above-described embodiments are intended to be examples only. Alterations, modifications and variations can be effected to the particular embodiments by those of skill in the art without departing from the scope, which is defined solely by the claims appended hereto.

What is claimed is:

1. A digital to analog conversion system comprising:
   a poly-phase digital filter providing parallel digital outputs; and
   a digital to analog converter (DAC) including:
   an analog multiplexer;
   a plurality of data inputs configured to receive, as inputs to the DAC, the parallel digital outputs of the poly-phase digital filter such that the digital outputs are combined only in the analog domain; and
   a 1-hot-of-N encoder configured to encode the outputs of the poly-phase digital filter in 1-hot-of-N signaling to produce 1-hot-of-N signals, the 1-hot-of-N encoder comprising a non-overlap signal generator configured to condition the analog 1-hot-of-N signals.

2. The system of claim 1 wherein the parallel digital outputs of the poly-phase digital filter are interleaved directly in the analog domain in a final stage of the DAC.

3. The system of claim 1 wherein the unrecombined parallel digital outputs of the poly-phase digital filter are directly combined in the analog domain in the DAC instead of being used as an intermediate signal.

4. The system of claim 1 wherein the poly-phase digital filter comprises an N-phase digital block filter directly connected to N-inputs of the multiplexing analog DAC.

5. The system of claim 1 wherein the poly-phase digital filter comprises:
a delta-sigma modulator (DSM) configured to reduce a word size of received over-sampled data and shape quantization noise.

6. The system of claim 5 further comprising:
an additional digital filter cascaded with the DSM to perform additional digital signal conditioning functions.

7. The system of claim 6 wherein the additional digital filter is configured to perform interpolation, low-pass filtering, band-pass filtering, high-pass filtering, sin x/x correction, equalization, phase correction or DC offset correction.

8. The system of claim 1 wherein the 1-hot-of-N signals are used to directly drive the analog multiplexer in the DAC.

9. The system of claim 1 wherein the non-overlap signal generator is configured to generate non-overlap signals based on the 1-hot-of-N signals output by the 1-hot-of-N encoder.

10. The system of claim 9 wherein the non-overlap signal generator comprises N parallel signal conditioning stages for an interleaving ratio of N.

11. The system of claim 10 wherein the N signal conditioning stages are cross-connected such that when a first signal is transitioning in one direction, a second signal transitioning in an opposite direction is delayed until the first transition is complete.

12. The system of claim 11 wherein the N signal conditioning stages are cross-connected such that when the first signal transitions from low to high, the second signal is delayed such that the second signal transition from high to low begins after the first signal transition is completed.

13. The system of claim 11 wherein the cross-connections produce a non-overlap period of a single inverter delay.

14. A digital to analog conversion method comprising:
providing a plurality of parallel digital outputs from a poly-phase digital filter;
receiving, at a digital to analog converter (DAC), the parallel digital outputs of the poly-phase digital filter;
encoding, only in the analog domain, the outputs of the poly-phase digital filter in 1-hot-of-N signaling to produce 1-hot-of-N signals; and
conditioning the analog 1-hot-of-N signals.

15. The method of claim 14 further comprising:
interleaving the parallel digital outputs of the poly-phase digital filter directly in the analog domain in a final stage of the DAC.

16. The method of claim 14 further comprising:
directly combining, in the analog domain in the DAC, unrecombined parallel digital outputs of the poly-phase digital filter.

17. The method of claim 14 wherein the digital outputs are used directly as inputs to the DAC instead of as intermediate signals requiring digital recombination.

18. A digital to analog converter (DAC) comprising:
an analog multiplexer;
a plurality of data inputs configured to receive, as inputs to the DAC, parallel digital outputs of a poly-phase digital filter; and
a 1-hot-of-N encoder configured to encode, only in the analog domain in the DAC, the outputs of the poly-phase digital filter in 1-hot-of-N signaling to produce 1-hot-of-N signals, the 1-hot-of-N encoder comprising a non-overlap signal generator configured to condition the analog 1-hot-of-N signals.

19. A digital to analog conversion method comprising:
receiving, directly at a digital to analog converter (DAC) instead of as intermediate signals requiring digital recombination, parallel digital outputs of a poly-phase digital filter such that the digital outputs are combined only in the analog domain;
encoding, only in the analog domain and in the DAC, the outputs of the poly-phase digital filter in 1-hot-of-N signaling to produce 1-hot-of-N signals; and
conditioning the analog 1-hot-of-N signals.

* * * * *